United States Patent
Gwo

(10) Patent No.: US 7,012,016 B2
(45) Date of Patent: Mar. 14, 2006

(54) METHOD FOR GROWING GROUP-III NITRIDE SEMICONDUCTOR HETEROSTRUCTURE ON SILICON SUBSTRATE

(76) Inventor: Shangjr Gwo, 101, Sec. 2, Kuang-Fu Rd., Hsin-Chu City (TW)

( * ) Notice: Subject to any disclaimer, the term of this patent is extended or adjusted under 35 U.S.C. 154(b) by 48 days.

(21) Appl. No.: 10/714,649

(22) Filed: Nov. 18, 2003

(65) Prior Publication Data

US 2005/0106849 A1    May 19, 2005

(51) Int. Cl.
*H01L 21/28*    (2006.01)

(52) U.S. Cl. ............... 438/602; 438/603; 438/604

(58) Field of Classification Search ........ 438/698–699, 438/700–704; 257/79, 94
See application file for complete search history.

(56) References Cited

U.S. PATENT DOCUMENTS

| | | | |
|---|---|---|---|
| 6,593,016 B1 * | 7/2003 | Chiyo et al. ............ | 428/698 |
| 2003/0049916 A1 * | 3/2003 | Surya et al. ............ | 438/478 |
| 2004/0144990 A1 * | 7/2004 | Udagawa ............ | 257/103 |

* cited by examiner

*Primary Examiner*—Dung A. Le
(74) *Attorney, Agent, or Firm*—Rosenberg, Klein & Lee

(57) ABSTRACT

The present invention provides a method for growing group-III nitride semiconductor heteroepitaxial structures on a silicon (111) substrate by using a coincidently matched multiple-layer buffer that can be grown on the Si(111) substrate. The coincidently matched multiple-layer buffer comprises a single-crystal silicon nitride ($Si_3N_4$) layer that is formed in a controlled manner by introducing reactive nitrogen plasma or ammonia to the Si(111) substrate at a suitably high temperature. Then, an AlN buffer layer or other group-III nitride buffer layer is grown epitaxially on the single-crystal silicon nitride layer. Thereafter, the GaN epitaxial layer or group-III semiconductor heteroepitaxial structure can be grown on the coincidently matched multiple-layer buffer.

19 Claims, 7 Drawing Sheets

METHOD FOR GROWING GROUP-III NITRIDE SEMICONDUCTOR HETEROSTRUCTURE ON SILICON SUBSTRATE

BACKGROUND OF THE INVENTION

1. Field of the Invention

The present invention generally relates to a semiconductor structure, and more particularly to a method for growing a group-III nitride semiconductor heteroepitaxial structure on a silicon substrate.

2. Description of the Prior Art

The semiconductor light-emitting diode (LED) structure comprises a substrate, a light emitting structure, and a pair of electrode for powering the diode. The substrate can be an opaque or a transparent substrate. The Light emitting diodes are based on gallium nitride compounds which generally comprise: a transparent and insulating substrate, e.g., a sapphire substrate. In general, to overcome the substantial lattice mismatch between the insulating substrate, e.g., a sapphire substrate, and GaN compound semiconductor, it is a common practice to provide a thin buffer layer or a nucleation layer on the insulating substrate, which is formed followed by a layer on which an LED structure is grown. The growth of single crystals on the insulating substrates that has been studied for many years. Early works included the growth of both silicon and III–V compound semiconductors on a variety of insulating substrates that including sapphire. In these studies, it was determined the usage of nucleation or buffer layers is to reduce the occurrence of imperfections and the tendency towards twinning in the thicker layer grown thereon.

Group-III nitride semiconductors [GaN (gallium nitride), InN (indium nitride), AlN (aluminum nitride), and their alloys] have become the materials of choice for many optoelectronic applications, especially in the areas of fully-color or white light-emitting diodes (LEDs) and blue laser diodes (LDs). Some scientists and engineers have even predicated that group-III nitride semiconductors will become all-around semiconductors besides their already-commercialized applications in optoelectronics. At present, the major barrier for widespread applications of nitrides is lack of perfectly lattice-matched substrates for epitaxial growth. Sapphire ($Al_2O_3$) and silicon carbide (SiC) are two most popular materials as the substrates. Beside the large lattice mismatch, the insulation property of sapphire renders the processing of nitride devices more difficult and costly. On the other hand, the high price and limited size of silicon carbide also make the widespread GaN-on-SiC applications difficult. GaN-on-Si epitaxial technology represents an interesting alternative, which can eventually integrate the existing Si-based microelectronic technology and the novel functionalities provided by the group-III nitrides.

For GaN-on-Si heteroepitaxy, the AlN single-layered buffer can provide good results as reported in the literature, and leading to the demonstration of light-emitting diodes on Si. However, the mutual solubility of Al and Si is very high at the AlN buffer-layer growth temperature (about 820° C. vs. eutectic temperature 577° C.). Therefore, the inter-diffusion of Al and Si at the interface is severe, resulting in high unintentional doping levels in the epilayer and the Si substrate as well as the degradation in the film structural and optical quality.

On the other hand, it has been found that an amorphous or polycrystalline $SiN_x$ [silicon nitride ($Si_3N_4$) or silicon subnitride] layer can be formed by intentional or unintentional nitridation of the silicon substrate surface during the first stage of the group-III nitride growth. Moreover, $Si_3N_4$ is well known to be an effective diffusion barrier material. However, this amorphous or polycrystalline $SiN_x$ layer is prone to cause detrimental effects on the properties of GaN films grown on the Si substrate, since it is not possible to grow a high-quality crystalline film on an amorphous or polycrystalline surface. Therefore, it has been a common practice in the growth of group-III-nitrides film on the silicon substrate to avoid the formation of an amorphous or polycrystalline $SiN_x$ layer during the first stage of the group-III nitride growth. To overcome the effects of amorphous or polycrystalline $SiN_x$ on the growth quality and to facilitate an effective diffusion barrier layer the formation of a single-crystal diffusion baffler layer which can be lattice matched to the Si(111) surface is highly desirable.

SUMMARY OF THE INVENTION

It is an object of this invention to provide a multiple-layer buffer, comprising at least two layers of distinct material with sharp material transitions and epitaxial alignments between the layers on the crystalline silicon substrate and between the bottom layer of the buffer with the crystalline silicon substrate, to resolve the issue of the inter-diffusion between the interfaces of AlN/Si, GaN/Si, or InN/Si.

It is a further object of this invention to provide a single-crystal AlN/$Si_3N_4$ double-layered buffer with coincident lattice conditions on a Si(111) substrate that can alleviate the problems of lattice mismatch and interdiffusion, thereafter inducing high-quality heteroepitaxial growth.

According to abovementioned objects, the present invention provides a structure for resolving the issue of auto-doping, resulting from Al/Si, Ga/Si, or In/Si inter-diffusion when grown with a group-IIII nitride buffer layer. The structure comprises a Si(111) substrate that surface has been reconstructed by in-situ thermal annealing to remove the remained thin oxide layer and to prepare clean and smooth silicon surface at high temperature. Then, the key feature of the present invention, a multiple-layered buffer is formed on the reconstructed Si(111) substrate. The multiple-layered buffer includes a single-crystal silicon nitride layer and a single-crystal AlN layer or other group-III nitride semiconductor epitaxial layer thereon. Next, the GaN epilayer is grown on the multiple-layered buffer. The advantage of the present invention is that the multiple-layered buffer can improve heteroepitaxial growth with large lattice mismatch. Furthermore, the 1:2 and 5:2 coincident lattices formed at the interface of the single-crystal silicon nitride ($Si_3N_4$)/Si (111) and the interface of the single-crystal aluminum nitride AlN/single-crystal silicon nitride ($Si_3N_4$) respectively can be used to facilitate the multiple-layered buffer for high-quality GaN-on-Si heteroepitaxial growth. Thus, the inter-diffusion between group-III elements (Al, Ga, or In) and Si can be resolved and the epitaxial growth quality can be improved.

Moreover, the present invention provides a method for forming a group-III heteroepitaxial structure on a Si(111) substrate. The key feature of the present invention is that the multiple-layered buffer is formed on the Si(111) substrate. The multiple-layered buffer comprises a single-crystal silicon nitride ($Si_3N_4$) layer that is formed on the Si(111) substrate by introducing reactive nitrogen-plasma to the reconstructed Si(111) surface in the controlled manner to prevent the formation of amorphous or polycrystalline $SiN_x$ layer. Then, another buffer layer is an AlN layer or other group-III nitride layer, which is grown epitaxially on the single-crystal silicon nitride layer. Similarly, the group-III nitride heteroepitaxial structure is epitaxially grown on the AlN layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
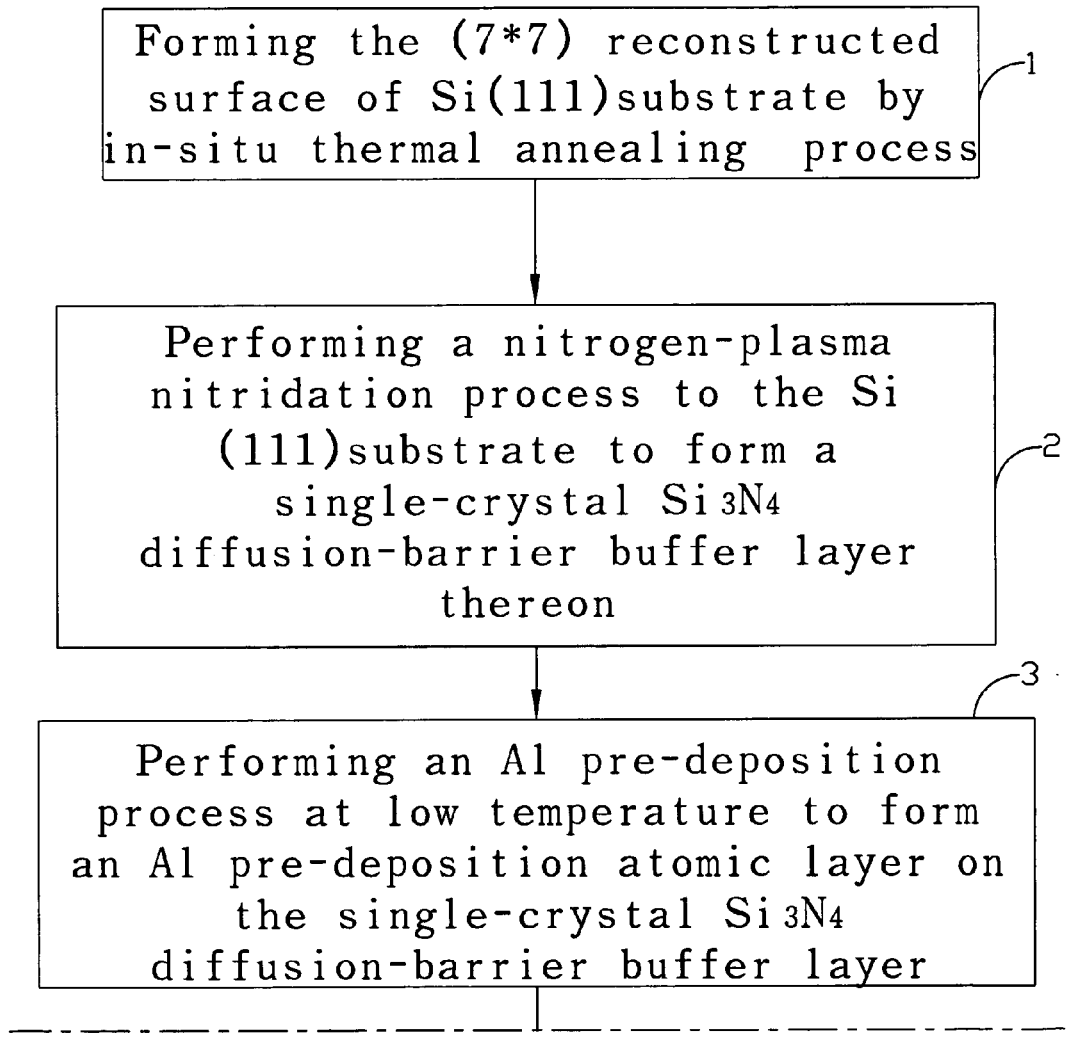
FIG. 1 is a flow diagram showing the steps for growing a group-III nitride semiconductor heteroepitaxial structure on a Si(111) substrate in accordance with a method disclosed herein.

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

According to the present invention is to provide a method and a stacked buffer structure for improving the inter-diffusion issue that occurs between AlN/Si, GaN/Si, and InN.

Group-III nitrides on silicon heteroepitaxy have recently demonstrated to be a viable alternative for growing high-quality group-III nitride films for optoelectronic, electronic, and surface acoustic wave device applications. Besides the availability of lager size (up to 12 inch in diameter), low cost, and excellent crystal quality of Si substrates, Si also possesses excellent material properties such as doping properties (amphoteric type and high carrier concentration), cleavability, good thermal conductivity (about 3 times larger than that of sapphire), and mature processing techniques. These advantages of Si substrates can open up many novel applications of group-III nitride materials, including the potential integration of GaN and Si technologies. The reason that high-quality GaN-on-Si heteroepitaxy is feasible that is due to the possible lattice matching of hexagonal wurtzite epitaxial films and diamond Si(111) crystal faces.

The stacked buffer consists of constituent layers, which can form coincident lattices at layer/layer and layer/substrate interfaces. In the preferred embodiment of the present invention, the buffer comprises at least two layers of distinct material with sharp material transitions and epitaxial alignments between the layers and between the bottom layer of the buffer layer and the Si(111) substrate. For the case of GaN-on-Si(111) heteroepitaxy, the present invention utilizes the 1:2 and 5:2 coincident lattices formed at the $\beta$-$Si_3N_4$ {0001}/Si(111) and AlN {0001}/$\beta$-$Si_3N_4$ {0001} interfaces respectively to facilitate the double-layered buffer for high-quality GaN-on-Si heteroepitaxial growth. By using this buffer technique, the present invention can resolve the issue of auto-doping, resulting from Al/Si inter-diffusion when grown with a single AlN {0001} coincident buffer. As the result, the epitaxial quality of GaN film is also significantly improved.

GaN on Si(111) heteroepitaxy constitutes a large +20.4% in-plane lattice mismatch ($\equiv \alpha_{Si} - \alpha_{GaN})/\alpha_{GaN}$; $\alpha_{GaN\{0001\}}$=3.189A; $\alpha_{Si(111)}$=3.840A) and large thermal expansion mismatch. Fortunately, by using a buffer layer with coincident lattice conditions can alleviate the lattice mismatch. For example, a 5:4 lattice coincidence between AlN {0001} ($\alpha_{AlN(0001)}$=3.112A) and Si(111) can reduce the lattice mismatch from 23.4% (tensile strain) to an effective lattice mismatch of −1.3% (compressive strain). As a result, two-dimensional smooth epitaxial growth mode was found to be possible due to the reduced strain.

The growth processes were conducted in a molecular-beam epitaxy (MBE) apparatus equipped with a radio frequency (RF) nitrogen plasma source. The base pressure in the MBE growth chamber is about $6*10^{-11}$ torr. High-purity Ga and Al metals are used for the conventional effusion cells. Nitrogen gas ($N_2$) is purified through a nitrogen purifier before fed into the radio-frequency plasma source. Nitrogen plasma is generated under the same conditions during all the growth processes. The RF power was about 450 watt and the nitrogen flow rate of the nitrogen was about 0.5 sccm. Three-inch Si(111) substrate (boron-doped p-type) is chemical etched before loading into the MBE chamber. The Si(111) substrate is further thermally annealed in situ to remove the remained thin oxide layer and to prepare a clean and smooth silicon surface at high temperature. The Si(111) substrate prepared by this process showed a clear (7×7) surface reconstruction, confirmed by the reflection high-energy electron diffraction (RHEED) pattern at about 800° C.

Furthermore, the RHEED pattern indicates a high-quality and smooth reconstructed Si surface prior to the growth process. The substrate temperature was calibrated by observing the (7×7) to (1×1) phase transition of Si(111) surface at 875° C. In the present invention, two different buffer-layer systems for GaN growth on Si(111) substrates were prepared for comparison. Both samples consist of an AlN buffer layer with a thickness of 30 nm. The only difference is that one sample contains a single-crystal $\beta$-$Si_3N_4$ layer [1.5-nm-thick layer with an abrupt interface with the Si(111) substrate, as confirmed by transmission electron microscopy (TEM)] before the AlN layer growth. Single-crystal silicon nitride layer can be formed by nitridation of the Si(111) surface under the reactive nitrogen plasma for 30 seconds at a substrate temperature of about 900° C. The 30 nm thick AlN buffer layers were grown epitaxially at 820° C. with a growth rate of 0.12 um/hr. Furthermore, the 240-nm-think GaN epitaxial layers are grown on the buffer layers at a lower substrate temperature (720° C.) with a growth rate of 0.08 $\mu$/hr.

Figure 1B:
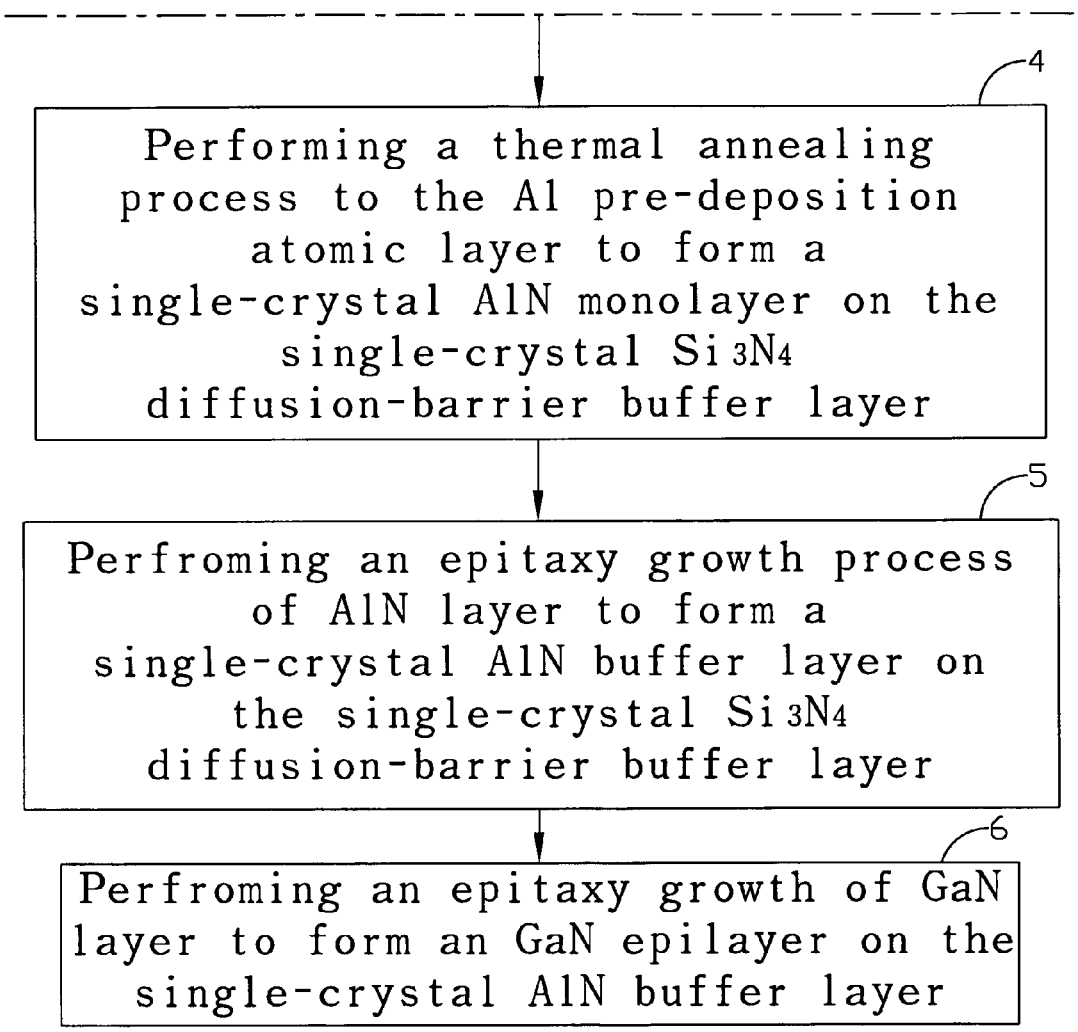

FIG. 1 shows a flow chart of the method for forming a double-layered buffer on the Si(111) substrate, wherein, FIG. 1 divided into FIG. 1A and FIG. 1B to show the formation process of double-layered buffer on the Si(111) substrate. Step 1 illustrates the Si(111) substrate that were thermally annealed in situ to remove the remained thin oxide layer and to prepare a clean and smooth silicon surface at high temperature. The Si(111) substrate prepared by the process showed a clear (7×7) surface reconstruction, that can be confirmed by the RHEED pattern at about 800° C. Step 2 illustrates the reactive nitrogen-plasma is introduced to the surface of the reconstructed Si(111) substrate in a controlled manner to form the single-crystal silicon nitride ($Si_3N_4$) diffusion-barrier buffer layer by nitridation of the surface of the Si(111) substrate. The surface of single-crystal $Si_3N_4$ diffusion-barrier buffer layer formed in step 2 is terminated by nitrogen surface adatoms. Step 3 illustrates the process for forming Al pre-deposition atomic layer on the single-crystal nitrogen-terminated $Si_3N_4$ diffusion-barrier buffer layer. Then, a thermal annealing process is performed to the Al pre-deposition atomic layer to form an AlN monolayer on the single-crystal $Si_3N_4$ diffusion-barrier buffer layer without the reactive nitrogen species (step 4). Next, an epitaxial AlN buffer layer is formed on the single-crystal $Si_3N_4$ diffusion-barrier buffer layer by performing an AlN epitaxial growth process on the AlN monolayer (step 5). Finally, a GaN epitaxial film with a or a group-III nitride semiconductor heteroepitaxial structure is grown by an epitaxial growth method on the single-crystal AlN buffer layer (step 6).

Figure 2A:
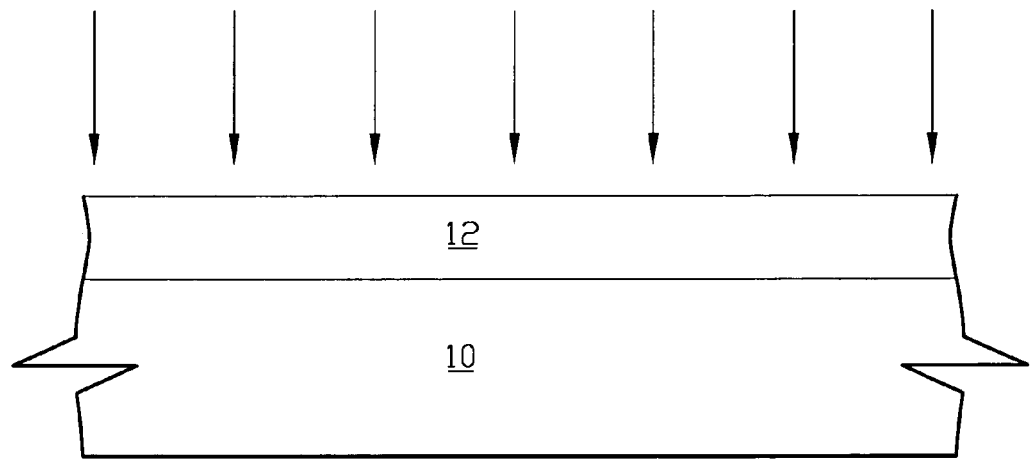
FIG. 2A through FIG. 2D are schematic representations the structure of various stages during the formation of a group-III nitride semiconductor heteroepitaxial structure on a Si(111) substrate in accordance with a method disclosed herein.

Then, referring to FIG. 2A, the Si(111) substrate 10 is initially treated by in-situ annealing process or ex-situ wet etching process (such as etching by an HF solution) to remove the remained thin oxide layer and to prepare a clean and smooth silicon surface. The Si(111) substrate 10 prepared by the thermal annealing process shows a clear (7×7) surface reconstruction, and is confirmed by the reflection high-energy electron diffraction (RHEED) pattern at about 800° C. The RHEED pattern can be used to confirm a high-quality and smooth reconstructed Si(111) substrate surface prior to the growth processes. The substrate temperature is calibrated by observing the (7×7) to (1×1) phase transition of Si(111) surface at 875° C.

Next, the key feature of the present invention is that the diffusion-barrier buffer layer 12 such as a single-crystal silicon nitride layer is formed by nitrogen-plasma nitridation of the surface of Si(111) substrate 10. The nitridation process is performed by exposing the surface of Si(111) substrate 10 to the reactive nitrogen plasma for about 30 seconds at a substrate temperature of about 900° C. Exposure time is critically controlled to prevent the unwanted formation of amorphous or polycrystalline $SiN_x$ layer. In the present invention, the single-crystal silicon nitride [$\beta$-$Si_3N_4$\{0001\}] layer 12 can also be formed on the Si(111) substrate 10 by introduction of reactive nitrogen-containing species including $NH_3$ while the surface of Si(111) substrate 10 held slightly higher than the (7×7) to (1×1) phase transition temperature. A single-crystal (4×4) surface-reconstruction (alternatively, the "(8×8)"-reconstruction in terms of the Si(111) substrate 10 lattice parameter) usually forms after such controlled nitridation process.

The RHEED pattern shows the "(8×8)"-reconstructed surface after introducing the reactive nitrogen plasma to the surface of Si(111) substrate at the substrate temperature of 900° C. for about 30 seconds. The RHEED pattern shows that are two different ordering on $\beta$-$Si_3N_4$\{0001\}. One ordering corresponding to the topmost "(8/3×8/3)"-ordered nitrogen adatoms and the other corresponds to the "(8×8)" lattice periodicity. In the previous scanning tunneling microscopy experiments, the "(8×8)" ordering was confirmed to be the reconstruction unit cell of the $\beta$-$Si_3N_4$ \{0001\} surface.

Figure 2B:
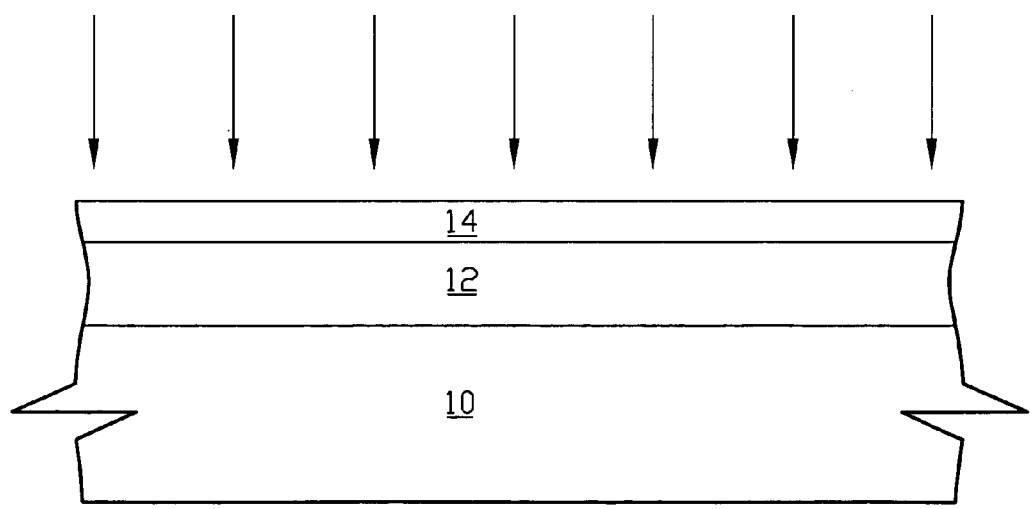
Figure 2C:
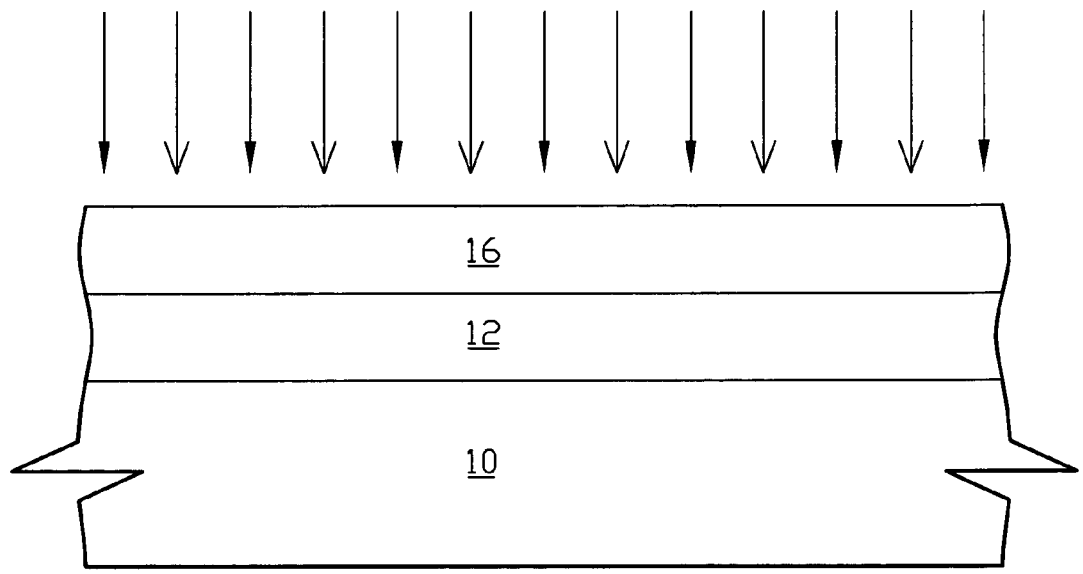

Then, the growth of AlN buffer layer 16 in the double-layered buffer system was started on the nitrogen-terminated $Si_3N_4$ reconstruction surface as shown in FIGS. 2B and 2G. After 15 seconds of Al pre-deposition process, the Al atomic layer 14 is formed on the surface of single-crystal $Si_3N_4$ layer 12. Then, a single-crystal AlN buffer layer 16 stacked on the single-crystal $Si_3N_4$ layer 12 is formed first by performing a thermal annealing process to the AlN pre-deposition atomic layer 14. The AlN (0001) (1×1) ordering appears in the streaky RHEED pattern after the thermal annealing step. The RHEED pattern indicates that Al atoms are bounded with the topmost N adatoms of the single-crystal $Si_3N_4$ layer 12 and the surface is very smooth. It should be noted that the reciprocal space periodicities along the bulk $\beta$-$Si_3N_4$ <2-1-10>12 and AlN <2-1-10>16 directions are 4:5 and this condition can be confirmed in the RHEED pattern. Then, an AlN buffer layer 16 is grown by an epitaxial growth method on the single-crystal $Si_3N_4$ layer 12. In addition, it is also possible that the second buffer layer stacked on the single-crystal $Si_3N_4$ diffusion-barrier buffer layer 12 is a GaN (gallium nitride) layer or InN (indium nitride) layer.

In order to compare the effects of single-crystal AlN single-layered buffer and AlN/$Si_3N_4$ double-layered buffer on the grown film quality, the AlN buffer layer 16 with an identical thickness about 30 nm were grown epitaxially on two Si substrates with and without the single-crystal $Si_3N_4$ layer 12 at a substrate temperature of 820° C. and a growth rate of 0.12 $\mu$m/hr. Moreover, the GaN epitaxial layers 20 with an identical thickness about 240 nm were grown on the single-crystal AlN buffer layers 16 of these two samples at a lower substrate temperature which is about 720° C. with a growth rate of 0.08 $\mu$m/hr.

Figure 2D:
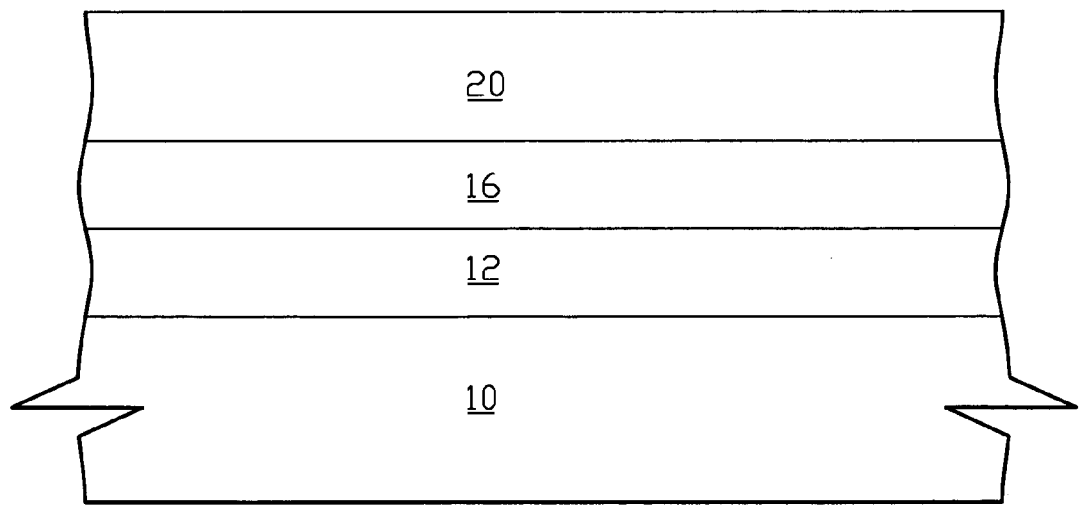

As referring to FIG. 2D, the present invention provides a light-emitting device structure with a double-layered buffer to resolve the issue of the auto-doping, resulted from the inter-diffusion of Al/Si and Ga/Si when grown with a single AlN \{0001\} coincident buffer. The light-emitting device provides a Si(111) substrate 10 with in-plane lattice constant of 3.84 angstroms. The key feature of the present invention is a double-layered buffer on the Si(111) substrate 10. In the preferred embodiment of the present invention, the double-layered buffer can improve the light-emitting efficiency for the light emitting device, wherein the double-layered buffer includes a single crystal silicon nitride layer ($Si_3N_4$) \{0001\} 12 with in-plane lattice constant 7.61 angstroms, and the AlN \{0001\} layer 16 with in-plane lattice constant 3.112 angstroms.

In addition, the present invention shows a streaky RHEEED pattern after 10-min AlN growth at 840° C. and indicates that the resulting epitaxial AlN buffer layer 16 has a smooth surface and is of high film quality. A GaN epilayer grown on the single-crystal $Si_3N_4$/AlN double-layered buffer by MBE also has a smooth surface morphology and high crystalline quality as demonstrated by the in-situ streaky RHEED pattern and is confirmed by ex-situ X-ray diffraction (XRD) and atomic force microscopy (AFM) measurements. Herein, the possible overgrown heteroepitaxial structure on top of the double-layered buffer includes a group-III nitride semiconductor single epitaxial layer or group-III nitride semiconductor multiple heteroepitaxial layers. From the in-situ RHEED and ex-situ XRD measurements, the present invention can determine that 1:2 and 5:2 coincident lattice interfaces are formed at $\beta$-Si$_3$N$_4$ {0001}/Si(111) and AlN(0001)/$\beta$-Si$_3$N$_4$ {0001} interfaces, respectively.

Furthermore, the following epitaxial orientation relationships are found by the RHEED and XRD studies: $\beta$-Si$_3$N$_4$ {0001}||Si(111); $\beta$-Si$_3$N$_4$ <-1 1 0>||Si[11_ -2]; $\beta$-Si$_3$N$_4$ <2 -1 -1 0>||Si <-1 1 0> and AlN {0001}||$\beta$-Si$_3$N$_4$ {0001}; AlN <0 -1 1 0>||$\beta$-Si$_3$N$_4$ <0 -1 1 0>; AlN <2 -1 -1 0>||$\beta$-Si$_3$N$_4$ <2 -1 -1 0>. Thus, the GaN/AlN/$\beta$-Si$_3$N$_4$ c-axis is perpendicular to the surface of Si(111) substrate. It is tempting to perform heteroepitaxy of GaN on the Si(111) substrate using a single $\beta$-Si$_3$N$_4$ buffer layer (without the AlN buffer layer). However, the present invention confirms that the resulting growth is rough and polycrystalline in the first growth stage as indicated by the spotty RHEED pattern during the initial GaN film growth. Therefore, the double-layered buffer approach can yield better interface properties between the epilayer and the buffer.

The GaN epilayer grown under the same growth conditions using a single AlN buffer layer also shows a similar high-quality RHEED pattern. Therefore, in order to compare the influences of these different buffer layers, secondary-ion mass spectroscopy (SIMS), XRD, photoluminescence (PL), and Raman scattering measurements were conducted to compare the structural and the optical properties of these GaN films with and without the single-crystal $\beta$-Si$_3$N$_4$ buffer layer.

Figure 3:
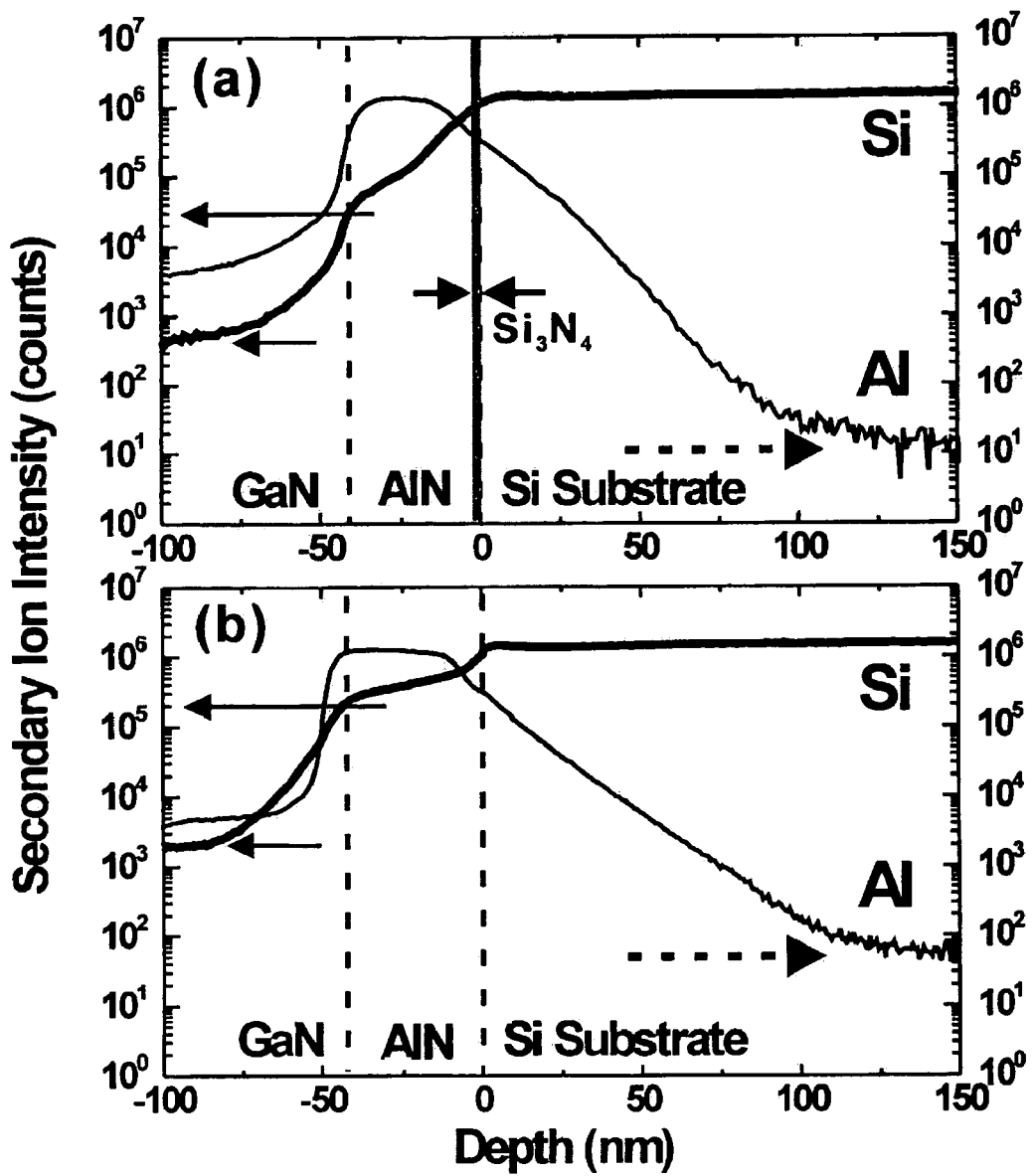
FIG. 3 is a schematic representation the SIMS depth profiles near the buffer/substrate and the epilayer/buffer interface regions for samples with a single-crystal AlN/$Si_3N_4$ double-layered buffer (a) and a single-crystal AlN single-layered buffer layer (b) in accordance with a method disclosed herein.

Firstly, the impurity distribution in the growth direction can be detected by SIMS. In order to investigate the auto-doping effects while GaN grown on the Si(111) substrate, the present invention focus on Al and Si ion signal depth profiles in the GaN/AlN and AlN/Si interface regions. The SIMS spectra were obtained by using a 7.7 keV Cs$^+$ primary beam and were used to probe Al and Si depth profiles in GaN films grown on Si(111) substrate using two buffer layer systems. The depth zero points of each SIMS spectrum are set at the top of Si(111) substrates. Focusing on the Si depth profiles in AlN buffers and GaN epitaxial layers, the magnitudes of the Si ion signal are indicated by the solid arrows in FIG. 3. From the SIMS spectra, the magnitudes of Si impurities in the AlN buffer layer and the GaN film using a single-crystal $\beta$-Si$_3$N$_4$ {0001}/AlN {0001}/Si(111) double-layered buffer is about one order of magnitud using an AlN single-layered buffer.

Not only the single-crystal Si$_3$N$_4$ layer inhibits the Si diffusion into the AlN and GaN layers, it also prevents the Al diffusion into the silicon substrate during the high-temperature growth of AlN buffer layer. And, the magnitude of the Al ion signal in Si(111) substrate is also about one order of magnitude lower than that grown without the single-crystal Si$_3$N$_4$ diffusion barrier layer. Therefore, the SIMS spectra show that single-crystal Si$_3$N$_4$ layer effectively prevents the Si diffusion into the AlN and GaN layer and the Al diffusion into the silicon substrate during the AlN high-temperature growth and the sequential GaN growth stages.

Figure 4A:
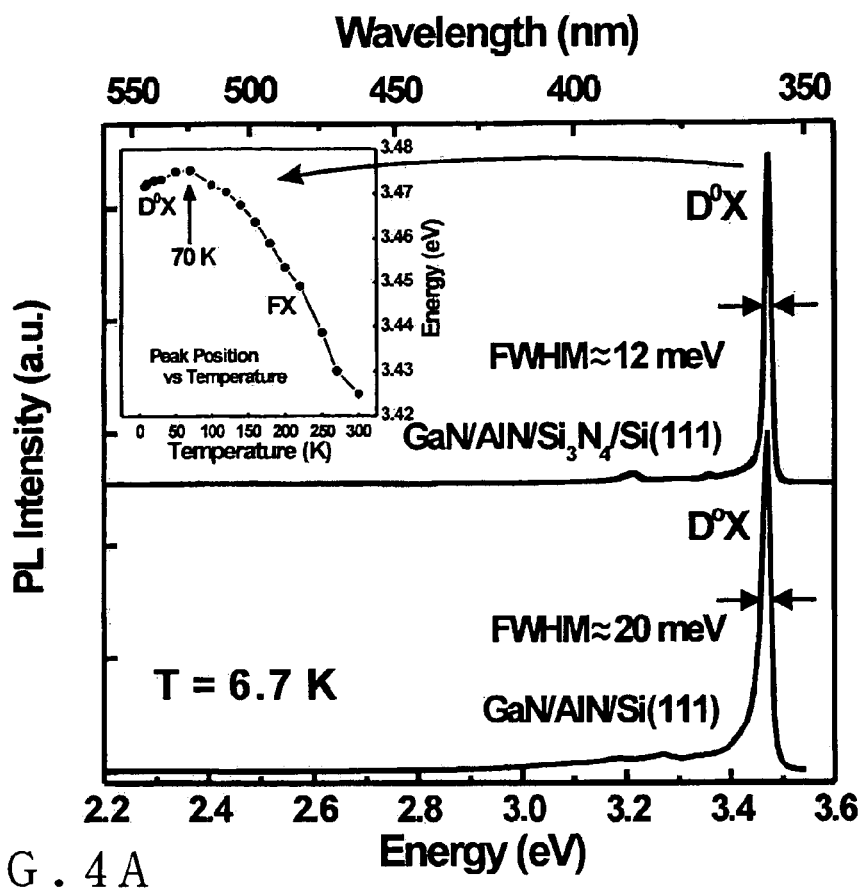
FIG. 4A is a schematic representation the low-temperature PL spectra of GaN epilayer grown on Si(111) using single-crystal AlN/$Si_3N_4$ and AlN buffer layers in accordance with a structure disclosed herein.
Figure 4B:
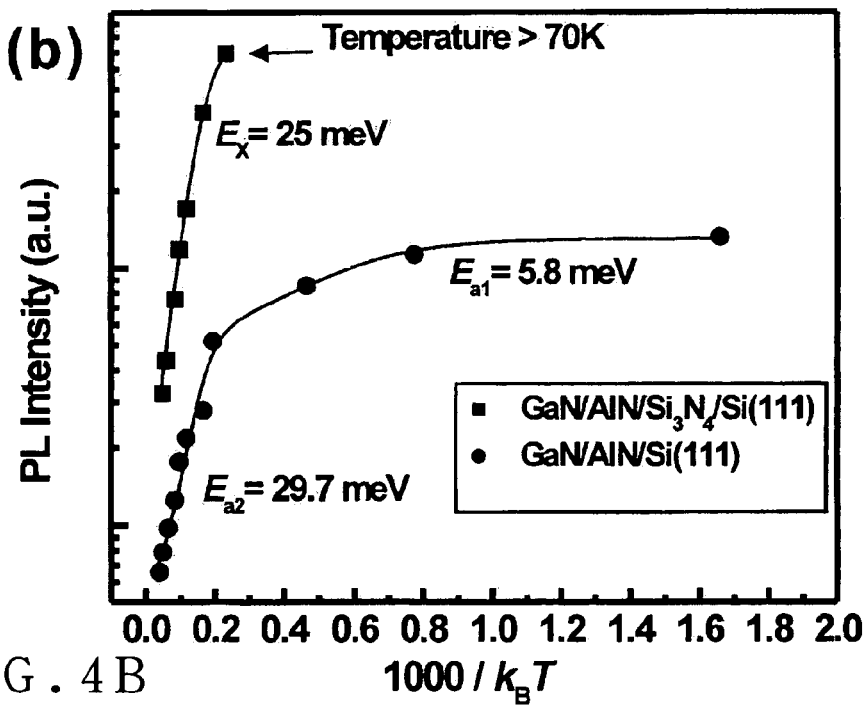
FIG. 4B is a schematic representation showing the Arrhenius plots of the luminescence intensities of free exciton (FX) grown on a single-crystal AlN/$Si_3N_4$ double-layered buffer and neutral-donor-bound exciton grown on single-crystal AlN single buffer layer in accordance with a structure disclosed herein.

FIGS. 4A and 4B show the comparison of the optical properties of GaN films that grown on different buffer. The low-temperature (6.7 K) PL spectra indicate that the GaN film grown on single-crystal AlN/Si$_3$N$_4$/Si(111) has a smaller full width at half maximum (FWHM) of neutral-donor-bound exciton (D$^0$X) near-band-edge luminescence peak than that of the GaN film grown on AlN/Si(111). The decrease in the FWHM value of PL peak (12 meV vs. 20 meV) is consistent with the deduction of dislocation density (7×10$^8$ cm$^{-2}$ vs. 1.1×10$^9$ cm$^{-2}$) measured by AFM, confirming a significant improvement in the epilayer crystalline quality. The inset in FIG. 4A displays the main luminescence peak position in the PL spectra of GaN grown on single-crystal AlN/Si$_3$N$_4$/Si(111) at different temperatures, indicating that the dominant PL peak changes to the free exciton (FX) emission at increasing temperatures (higher than 70 K, 70 k$_B$T$\approx$ the localization energy E$_{loc}$ of neutral Si donor). In contrast to this behavior, for the AlN single-layered buffer sample, the D$^0$X peak can be followed up to the room temperature. This observation is consistent with the SIMS results; i.e., the GaN film grown on the single-crystal AlN/Si$_3$N$_4$/Si(111) contains much less Si impurities.

FIG. 4B presents the Arrhenius plots of the luminescence intensities of FX in GaN grown on the single-crystal double-layered buffer and D$^0$X in GaN grown on the single-layered buffer. From the Arrhenius plots, the activation energy of FX (E$_x$) in the GaN grown on the single-crystal AlN/Si$_3$N$_4$/Si(111) was obtained by fitting the thermal activation relation to be about 25 meV, in good agreement with the reported value for FX in undoped GaN. Furthermore, the activation energies of the non-radiative recombination of D$^0$X in GaN grown on the single-crystal AlN/Si(111) can be fitted by using two thermal activation energies (E$_{a1}$ and E$_{a2}$). The obtained values of E$_{a1}$ and E$_{a2}$ correspond well to the known localization energy (E$_{loc}$~6 meV) and donor binding energy (E$_D$~29 meV) of Si impurities in GaN.

Figure 5:
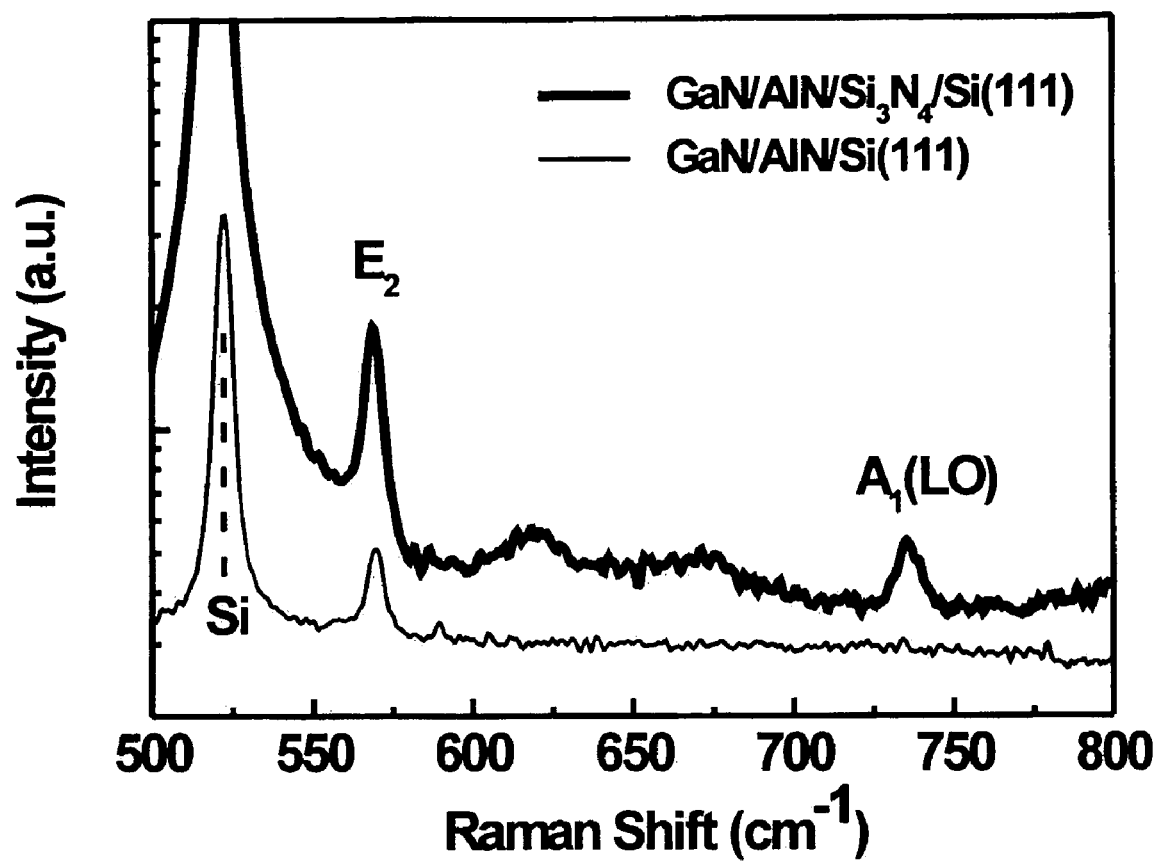
FIG. 5 is a schematic representation showing the room temperature Raman spectra taken from the GaN epilayer grown on Si(111) substrate using single-crystal AlN/$Si_3N_4$ and AlN buffer layers in accordance with a structure disclosed herein.

The present invention performed Raman scattering measurements to compare the crystal qualities of GaN epitaxial layers grown on Si(111) by using two different buffer. FIG. 5 displays typical non-polarized Raman spectra in logarithmic intensity scale collected in backscattering geometry along the GaN c ([0001]) axis (along the growth direction) using the 514.5 nm radiation of an Ar$^+$ ion laser as a light source, including the dominant phonon peak from Si substrate near 520 cm$^{-1}$. The phonon bands near 568 cm$^{-1}$ in each Raman spectra correspond to the GaN E$_2$ bands. Besides, the A$_1$ (LO) band near 735 cm$^{-1}$ is observed only in the GaN film grown on the single-crystal double-layered buffer and it represents that this GaN film has a lower carrier concentration. According to the previous investigation, the ratio of E$_2$ to A$_1$(LO) Raman intensity is ~3 for the undoped GaN films. The present invention measures the E$_2$ to A$_1$(LO) intensity ratio of the GaN film grown on the single-crystal double-layered buffer is about 3.3 (only slightly larger than 3), indicating the carrier concentration is quite low. This is consistent with the SIMS spectra, which show a lower Si concentration in the GaN film grown on Si(111) using a single-crystal AlN/Si$_3$N$_4$ double-layered buffer.

Although specific embodiments have been illustrated and described, it will be obvious to those skilled in the art that various modifications may be made without departing from what is intended to be limited solely by the appended claims.

What is claimed is:

1. A method for forming a semiconductor structure, said method comprising:
   providing a crystalline silicon (111) substrate;
   forming a single-crystal silicon nitride layer on said crystalline silicon (111) substrate with sharp material transitions and epitaxial alignments between said single-crystal silicon nitride layer and said crystalline silicon substrate;
   forming a single-crystal group-III nitride layer on said crystalline silicon (111) substrate with sharp material transitions and epitaxial alignments between said single-crystal group-III nitride layer and said single-crystal silicon nitride layer; and forming a group-III nitride semiconductor structure on said single-crystal group-III layer.

2. The method according to claim 1, wherein said forming said single-crystal silicon nitride layer comprises performing a nitrogen-plasma nitridation to said crystalline silicon (111) substrate.

3. The method according to claim 1, wherein said forming said single-crystal silicon nitride layer comprises performing a thermal nitridation to said crystalline silicon (111) substrate.

4. The method according to claim 1, wherein said forming said single-crystal silicon nitride layer comprises performing a chemical vapor deposition to said crystalline silicon (111) substrate.

5. The method according to claim 1, wherein said forming said single-crystal group-III nitride layer comprises:

performing an aluminum pre-deposition process to said single-crystal silicon nitride layer terminated by nitrogen surface adatoms without introducing reactive nitrogen species to form an aluminum pre-deposition atomic layer on said single silicon nitride layer;

performing a thermal annealing process to said aluminum pre-deposition atomic layer to form a single-crystal aluminum nitride monolayer on said single-crystal silicon nitride layer; and performing an aluminum nitride epitaxial growth process to said single-crystal aluminum nitride monolayer to form said group-III nitride layer on said single-crystal aluminum nitride monolayer.

6. The method according to claim 1, wherein said group-III nitride semiconductor structure is formed by chemical vapor deposition method.

7. The method according to claim 1, wherein said group-III nitride semiconductor structure is formed by molecular beam epitaxy method.

8. The method according to claim 1, wherein said group-III nitride semiconductor structure is a group-III nitride single layer.

9. The method according to claim 1, wherein said group-III nitride semiconductor structure is a group-III nitride multiple-layer structure.

10. The method according to claim 1, wherein said group-III nitride semiconductor structure is an indium nitride epitaxial layer.

11. A method for growing a group-III nitride semiconductor heteroepitaxial structure, said method comprising:

providing a silicon (111) substrate;

performing a nitrogen-plasma nitridation process to said silicon (111) substrate to form a single-crystal silicon nitride layer on said silicon (111) substrate;

performing an aluminum pre-deposition process to said single-crystal silicon nitride layer terminated by nitrogen surface adatoms without introducing reactive nitrogen species to form an aluminum pre-deposition atomic layer on said single-crystal silicon nitride layer; - performing a thermal annealing process to said aluminum pre-deposition atomic layer to form a single-crystal aluminum nitride monolayer on said single-crystal silicon nitride layer;

performing an aluminum nitride epitaxial growth process to said single-crystal aluminum nitride monolayer to form an aluminum nitride epitaxial buffer layer on said single-crystal silicon nitride layer; and forming a group-III nitride semiconductor heteroepitaxial structure by epitaxial process on said aluminum nitride epitaxial buffer layer.

12. The method according to claim 11, further comprising performing a thermal annealing in ultrahigh vacuum to said silicon (111) substrate to form a reconstructed silicon (111) surface.

13. The method according to claim 11, further comprising performing an active hydrogen plasma cleaning process to said silicon (111) substrate to form a clean and smooth silicon (111) substrate.

14. The method according to claim 11, further comprising performing an ex-situ wet etching process to said silicon (111) substrate to form a clean and smooth silicon (111) surface.

15. The method according to claim 11, wherein said performing a nitrogen-plasma nitridation process to said silicon (111) substrate to form a said single-crystal silicon nitride layer on said silicon (111) substrate is a thermal nitridation process.

16. A method for forming a semiconductor structure, said method comprising:

providing a crystalline silicon (111) substrate;

forming a single-crystal silicon nitride layer on said crystalline silicon (111) substrate;

performing an aluminum pre-deposition process to said single-crystal silicon nitride layer terminated by nitrogen surface adatoms without introducing reactive nitrogen species to form an aluminum pre-deposition atomic layer on said single silicon nitride layer;

performing a thermal annealing process to said aluminum pre-deposition atomic layer to form a single-crystal aluminum nitride monolayer on said single-crystal silicon nitride layer; and performing an aluminum nitride epitaxial growth process to said single-crystal aluminum nitride monolayer to form a group-III nitride layer on said single-crystal aluminum nitride monolayer.

17. The method according to claim 16, wherein said forming said single-crystal silicon nitride layer comprises performing a nitrogen-plasma nitridation to said crystalline silicon (111) substrate.

18. The method according to claim 16, wherein said forming said single-crystal silicon nitride layer comprises performing a thermal nitridation to said crystalline silicon (111) substrate.

19. The method according to claim 16, wherein said forming said single-crystal silicon nitride layer comprises performing a chemical vapor deposition to said crystalline silicon (111) substrate.

* * * * *